(12) United States Patent
Baars et al.

(10) Patent No.: US 12,113,070 B2
(45) Date of Patent: Oct. 8, 2024

(54) TRANSISTOR INTEGRATION ON A SILICON-ON-INSULATOR SUBSTRATE

(71) Applicant: GlobalFoundries U.S. Inc., Malta, NY (US)

(72) Inventors: Peter Baars, Dresden (DE); Viorel Ontalus, Unionville, CT (US); Ketankumar H. Tailor, Dresden (DE); Michael Zier, Dresden (DE); Crystal R. Kenney, Waterford, NY (US); Judson Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 85 days.

(21) Appl. No.: 17/830,830

(22) Filed: Jun. 2, 2022

(65) Prior Publication Data
US 2023/0395607 A1 Dec. 7, 2023

(51) Int. Cl.
*H01L 27/12* (2006.01)
*H01L 21/84* (2006.01)
*H01L 29/66* (2006.01)

(52) U.S. Cl.
CPC .......... *H01L 27/1207* (2013.01); *H01L 21/84* (2013.01); *H01L 29/66242* (2013.01)

(58) Field of Classification Search
CPC ................ H01L 27/1207; H01L 21/84; H01L 29/66242; H01L 29/0649; H01L 21/761; H01L 29/0821; H01L 29/7371
USPC .......................................... 257/197; 438/235
See application file for complete search history.

(56) References Cited

U.S. PATENT DOCUMENTS

| 6,548,364 B2 | 4/2003 | Hsu |
| 6,555,874 B1 | 4/2003 | Hsu et al. |
| 6,555,891 B1* | 4/2003 | Furukawa et al. ...... H01L 21/84 |
| 6,936,910 B2 | 8/2005 | Ellis-Monaghan et al. |
| 11,145,725 B2 | 10/2021 | Liu et al. |
| 2017/0358608 A1* | 12/2017 | Verma et al. ....... H01L 27/1207 |
| 2019/0273028 A1 | 9/2019 | Jain et al. |
| 2021/0091214 A1 | 3/2021 | Ho et al. |

OTHER PUBLICATIONS

European Patent Office, Extended European Search Report and Written Opinion issued in European Patent Application No. 22201887.1 on May 25, 2023 (11 pages).

* cited by examiner

*Primary Examiner* — Fernando L Toledo
*Assistant Examiner* — Neil R Prasad
(74) *Attorney, Agent, or Firm* — Thompson Hine LLP; Francois Pagette

(57) ABSTRACT

Structures including a vertical heterojunction bipolar transistor and methods of forming a structure including a vertical heterojunction bipolar transistor. The structure comprises a semiconductor substrate including a trench, a first semiconductor layer including a portion adjacent to the trench, a dielectric layer between the first semiconductor layer and the semiconductor substrate, and a second semiconductor layer in the trench. The dielectric layer has an interface with the first semiconductor layer, and the second semiconductor layer includes a portion that is recessed relative to the interface. The structure further comprises a vertical heterojunction bipolar transistor including a collector in the portion of the second semiconductor layer.

20 Claims, 4 Drawing Sheets

TRANSISTOR INTEGRATION ON A SILICON-ON-INSULATOR SUBSTRATE

STATEMENT REGARDING FEDERALLY SPONSORED RESEARCH OR DEVELOPMENT

This invention was made with government support under HR0011-20-3-0002 awarded by the Defense Advanced Research Projects Agency. The government has certain rights in the invention.

BACKGROUND

The present disclosure relates to semiconductor device fabrication and integrated circuits and, more specifically, to structures including a vertical heterojunction bipolar transistor and methods of forming a structure including a vertical heterojunction bipolar transistor.

A bipolar junction transistor is a multi-terminal electronic device that includes an emitter, a collector, and an intrinsic base arranged between the emitter and collector. In an NPN bipolar junction transistor, the emitter and collector are comprised of n-type semiconductor material, and the intrinsic base is comprised of p-type semiconductor material. In a PNP bipolar junction transistor, the emitter and collector are comprised of p-type semiconductor material, and the intrinsic base is comprised of n-type semiconductor material. During operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates heterojunctions. For example, the collector and/or emitter of a heterojunction bipolar transistor may be constituted by silicon, and the intrinsic base of a heterojunction bipolar transistor may be constituted by silicon-germanium, which is characterized by a narrower band gap than silicon.

Improved structures including a vertical heterojunction bipolar transistor and methods of forming a structure including a vertical heterojunction bipolar transistor are needed.

SUMMARY

In an embodiment of the invention, a structure comprises a semiconductor substrate including a trench, a first semiconductor layer including a portion adjacent to the trench, a dielectric layer between the first semiconductor layer and the semiconductor substrate, and a second semiconductor layer in the trench. The dielectric layer has an interface with the first semiconductor layer, and the second semiconductor layer includes a portion that is recessed relative to the interface. The structure further comprises a vertical heterojunction bipolar transistor including a collector in the portion of the second semiconductor layer.

In an embodiment, a structure comprises a silicon-on-insulator substrate including first region and a second region. The first region includes a semiconductor layer, a semiconductor substrate, and a buried insulator layer between the semiconductor layer and the semiconductor substrate. The second region includes only the semiconductor substrate. The structure further comprises a field-effect transistor in the first region of the silicon-on-insulator substrate, and a vertical heterojunction bipolar transistor in the second region of the silicon-on-insulator substrate.

In an embodiment of the invention, a method comprises forming a trench in a semiconductor substrate and forming a second semiconductor layer in the trench. A first semiconductor layer includes a portion adjacent to the trench, a dielectric layer is positioned between the first semiconductor layer and the semiconductor substrate, the dielectric layer has an interface with the first semiconductor layer, and the second semiconductor layer includes a portion that is recessed relative to the interface. The method further comprises forming a vertical heterojunction bipolar transistor including a collector in the portion of the second semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
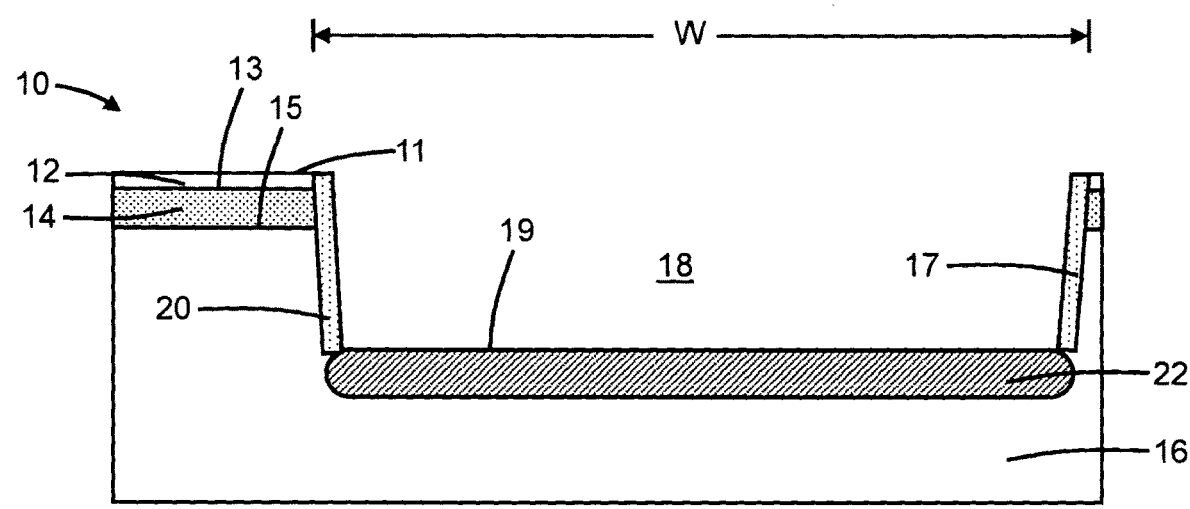
FIGS. 1-7 are cross-sectional views of a structure at successive fabrication stages of a processing method in accordance with embodiments of the invention.

With reference to FIG. 1 and in accordance with embodiments of the invention, a structure 10 includes a semiconductor layer 12, a dielectric layer 14, and a substrate 16. The semiconductor layer 12 is separated from the substrate 16 by the intervening dielectric layer 14. The semiconductor layer 12 may be comprised of a semiconductor material, such as single-crystal silicon, and may be intrinsic or lightly doped p-type. The dielectric layer 14 may be comprised of a dielectric material, such as silicon dioxide, that is an electrical insulator. The substrate 16 may be comprised of a semiconductor material, such as single-crystal silicon, and may be lightly doped p-type. The dielectric layer 14 has an upper interface 13 with the semiconductor layer 12, the dielectric layer 14 has a lower interface 15 with the substrate 16, and the upper and lower interfaces 13, 15 are separated by the thickness of the dielectric layer 14.

In an embodiment, the semiconductor layer 12, dielectric layer 14, and substrate 16 may be integrated into a silicon-on-insulator (SOI) substrate. In an embodiment, the semiconductor layer 12 may have a thickness suitable to fabricate fully-depleted silicon-on-insulator (FDSOI) field-effect transistors. In an embodiment, the semiconductor layer 12 may have a thickness in a range of about 1 nanometer (nm) to about 20 nm. In an embodiment, the dielectric layer 14 may have a thickness in a range of about 10 nm to about 50 nm.

A trench 18 is surrounded by a sidewall 17 that penetrates fully through the semiconductor layer 12 and dielectric layer 14. The trench 18 has a base 19 at given depth in the substrate 16 below the interfaces 13, 15. The trench 18 may be patterned by lithography and etching processes. The semiconductor layer 12 and dielectric layer 14 are fully removed by the formation of the trench 18. A dielectric collar 20 may be formed on the sidewall 17 of the trench 18 by depositing a conformal layer of dielectric material, such as silicon dioxide or silicon nitride, and anisotropically etching the deposited conformal layer. Unremoved sections of the semiconductor layer 12 and dielectric layer 14, which include intact portions of the interfaces 13, 15, are positioned adjacent to the sidewall 17 of the trench 18.

A well 22 may be formed in the substrate 16 beneath the base 19 of the trench 18 by introducing a dopant by, for example, ion implantation with given implantation conditions. A patterned implantation mask may be formed to define a selected area coincident with the trench 18 that is exposed for the implantation of ions. The implantation mask may include a layer of an organic photoresist that is applied and patterned to form an opening exposing the selected area and determining, at least in part, the location and horizontal dimensions of the well 22. The implantation mask has a thickness and stopping power sufficient to block the implantation of ions in masked areas. The implantation conditions (e.g., ion species, dose, kinetic energy) may be selected to tune the electrical and physical characteristics of the well 22. In an embodiment, the well 22 may be doped (e.g., heavily doped) with a concentration of an n-type dopant (e.g., arsenic) to provide n-type conductivity.

The well 22 may extend in a lateral direction beneath the base 19 of the trench 18, and the well 22 may further extend either to or past the sidewall 17 of the trench 18 beneath the corners at the intersection of the sidewall 17 with the base 19. In an embodiment, the well 22 may extend in a lateral direction in the substrate 16 over an entirety of a width W of the trench 18. The well 22 is positioned in a vertical direction fully below both of the interfaces 13, 15.

Figure 2:
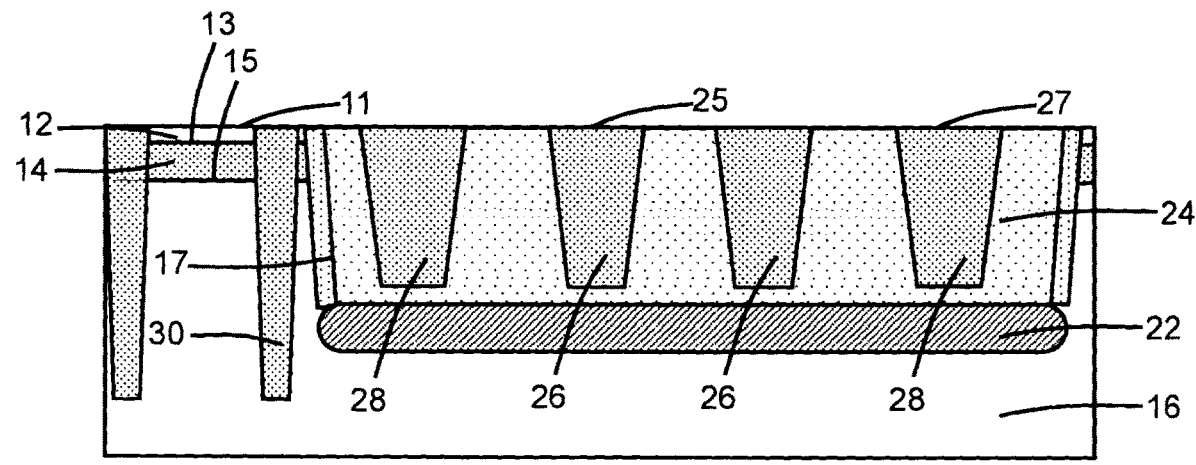

With reference to FIG. 2 in which like reference numerals refer to like features in FIG. 1 and at a subsequent fabrication stage of the processing method, a semiconductor layer 24 is formed within the trench 18 and over the well 22. The semiconductor layer 24 may be comprised of a semiconductor material that is epitaxially grown from the exposed surface of the substrate 16 at the bottom of the trench 18 and that is subsequently planarized by chemical-mechanical polishing. The dielectric collar 20 may prevent epitaxial growth of semiconductor material from the sidewall 17 of the trench 18. In an embodiment, the semiconductor layer 24 may be comprised of single-crystal silicon. The semiconductor layer 24 may be doped with a concentration of a dopant, such as a p-type dopant (e.g., boron) that provides p-type conductivity.

Shallow trench isolation regions 26, 28 are formed in the semiconductor layer 24 and extend partially through the semiconductor layer 24. The shallow trench isolation regions 26 are positioned in the vertical direction fully above the well 22. The shallow trench isolation regions 26 may each have a top surface 25 that is coplanar or substantially coplanar with a top surface 11 of the semiconductor layer 12. The shallow trench isolation regions 28 may each have a top surface 27 that may be coplanar or substantially coplanar with the top surface 11 of the semiconductor layer 12.

Deep trench isolation regions 30 are formed that penetrate fully through the semiconductor layer 12 and dielectric layer 14 and into the underlying substrate 16. The deep trench isolation regions 30 extend to a greater depth in the substrate 16 than the shallow trench isolation regions 26, 28. In particular, the deep trench isolation regions 30 may penetrate to a depth in the substrate 16 that is below the well 22.

The shallow trench isolation regions 26, 28 may be formed by patterning shallow trenches with lithography and etching processes, depositing a dielectric material to fill the shallow trenches, and planarizing and/or recessing the dielectric material. The deep trench isolation regions 30 may be formed by patterning deep trenches with lithography and etching processes, depositing a dielectric material to fill the deep trenches, and planarizing and/or recessing the dielectric material. In an embodiment, the shallow trench isolation regions 26, 28 and deep trench isolation regions 30 may contain a dielectric material, such as silicon dioxide, from a layer that is deposited by chemical vapor deposition to fill the trenches and then planarized by chemical-mechanical polishing.

Figure 3:
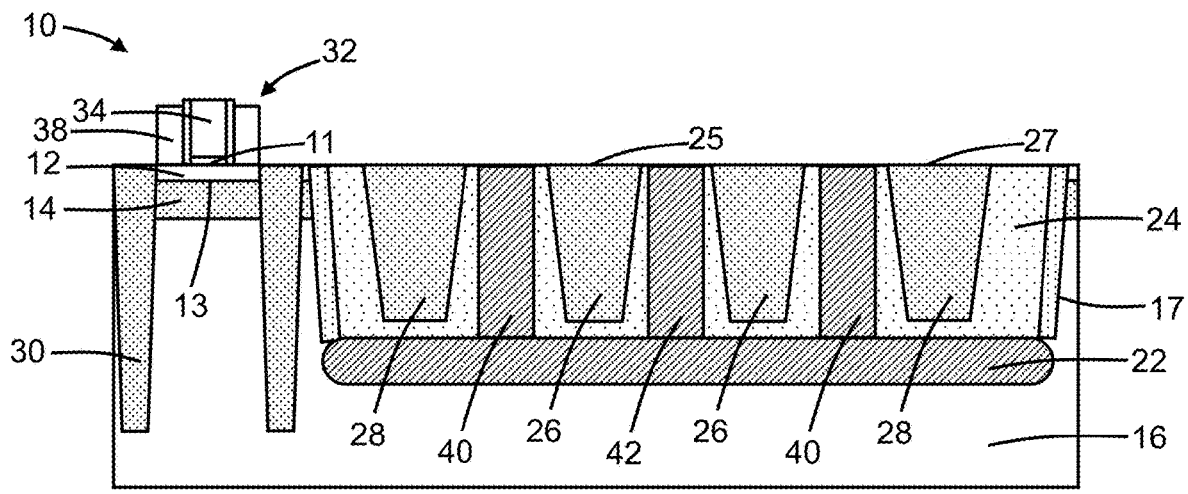

With reference to FIG. 3 in which like reference numerals refer to like features in FIG. 2 and at a subsequent fabrication stage of the processing method, a field-effect transistor 32 may be fabricated by front-end-of-line processing in a region of the semiconductor-on-insulator substrate isolated by the deep trench isolation regions 30 from a different region of the semiconductor-on-insulator substrate including the trench 18 and semiconductor layer 24. The region in which the field-effect transistor 32 is formed includes intact sections of the semiconductor layer 12 and dielectric layer 14.

The field-effect transistor 32 may include a gate electrode 34 and a gate dielectric layer 35 formed on the semiconductor layer 12 by depositing a layer stack and patterning the layer stack with photolithography and etching processes. The gate electrode 34 may be comprised of a conductor, such as doped polycrystalline silicon (i.e., polysilicon) or a work function metal, and the gate dielectric layer 35 may be comprised of an electrical insulator, such as silicon dioxide or hafnium oxide. The field-effect transistor 32 may include other elements such as raised source/drain regions 38 and sidewall spacers on the gate electrode 34. The field-effect transistor 32 may be a p-type field-effect transistor or an n-type field-effect transistor. The gate electrode 34 and raised source/drain regions 38 may project in a vertical direction from the semiconductor layer 12 by a distance in a range of about 25 nanometers to about 40 nanometers.

Doped regions 40 may be formed in the semiconductor layer 24 that extend fully through (i.e., reach through) the semiconductor layer 24 to the well 22. In an embodiment, the doped regions 40 may be formed by, for example, ion implantation of a dopant with given implantation conditions. A patterned implantation mask may be formed to define selected areas that are exposed for implantation by ions. The implantation mask may include a layer of an organic photoresist that is applied and patterned to form openings exposing the selected areas and determining, at least in part, the location and horizontal dimensions of the doped regions 40. The implantation mask has a thickness and stopping power sufficient to block the implantation of ions in masked areas. The implantation conditions (e.g., ion species, dose, kinetic energy) may be selected to tune the electrical and physical characteristics of the doped regions 40. In an embodiment, the doped regions 40 may be doped (e.g., heavily doped) with a concentration of an n-type dopant (e.g., arsenic) to provide n-type conductivity.

A doped region 42 may be formed in the semiconductor layer 24 that extends fully through (i.e., reaches through) the semiconductor layer 24 to the well 22 by introducing a dopant by, for example, ion implantation with given implantation conditions. A patterned implantation mask may be formed to define a selected area that is exposed for the implantation of ions. The implantation mask may include a layer of an organic photoresist that is applied and patterned to form an opening exposing the selected area and determining, at least in part, the location and horizontal dimensions of the doped region 42. The implantation mask has a thickness and stopping power sufficient to block the implantation of ions in masked areas. The implantation conditions (e.g., ion species, dose, kinetic energy) may be selected to tune the electrical and physical characteristics of the doped regions 40. In an embodiment, the doped region 42 may be doped with a concentration of an n-type dopant (e.g., arsenic) to provide n-type conductivity. The doped region 42 may be more lightly doped than the doped regions 40.

The doped region 42 is arranged in a lateral direction between the inner shallow trench isolation regions 26. The doped region 42 may provide a collector of a vertical heterojunction bipolar transistor. The doped regions 40, which are arranged in a lateral direction between the inner shallow trench isolation regions 26 and the outer shallow trench isolation regions 28, are accessible at the top surface of the semiconductor layer 24 for establishing an electrical contact with the collector. The well 22 provides a sub-collector of the vertical heterojunction bipolar transistor by extending in a lateral direction beneath the shallow trench isolation regions 26 to couple the doped regions 40 with the doped region 42. A portion of the well 22 is positioned between each of the doped regions 40 and the sidewall 17 of the trench 18.

Figure 4:
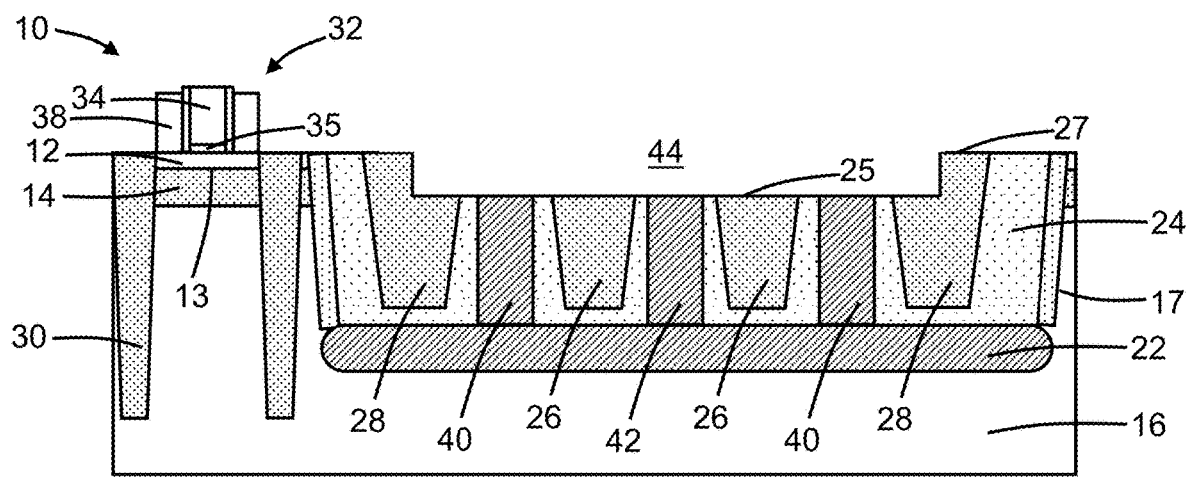

With reference to FIG. 4 in which like reference numerals refer to like features in FIG. 3 and at a subsequent fabrication stage of the processing method, a cavity 44 is formed by applying an etch mask and etching the semiconductor layer 24 and shallow trench isolation regions 26, 28. The doped regions 40, 42 and shallow trench isolation regions 26 are recessed by the formation of the cavity 44. The doped regions 40, 42 are reduced in height by the formation of the cavity 44 such that each of the doped regions 40, 42 is positioned fully below the interface 13. In an embodiment, the cavity 44 may be centered on the doped region 42.

A portion of the semiconductor layer 24, which is laterally between the outer shallow trench isolation regions 28, is recessed relative to the portion of the dielectric layer 14 that is adjacent to the trench 18 and, therefore, is recessed relative to the interface 13. The cavity 44 overlaps at its side edges with the shallow trench isolation regions 28. Due to the overlap, each shallow trench isolation region 28 includes a recessed portion that is recessed relative to the interface 13 and a non-recessed portion that projects above the recessed portion to define a step at the transition. The semiconductor layer 24 includes a non-recessed portion that is positioned in a lateral direction between the non-recessed portion of each shallow trench isolation region 28 and the sidewall 17 of the trench 18. The field-effect transistor 32 may be covered by a protection layer (not shown) during the formation of the cavity 44.

Figure 5:
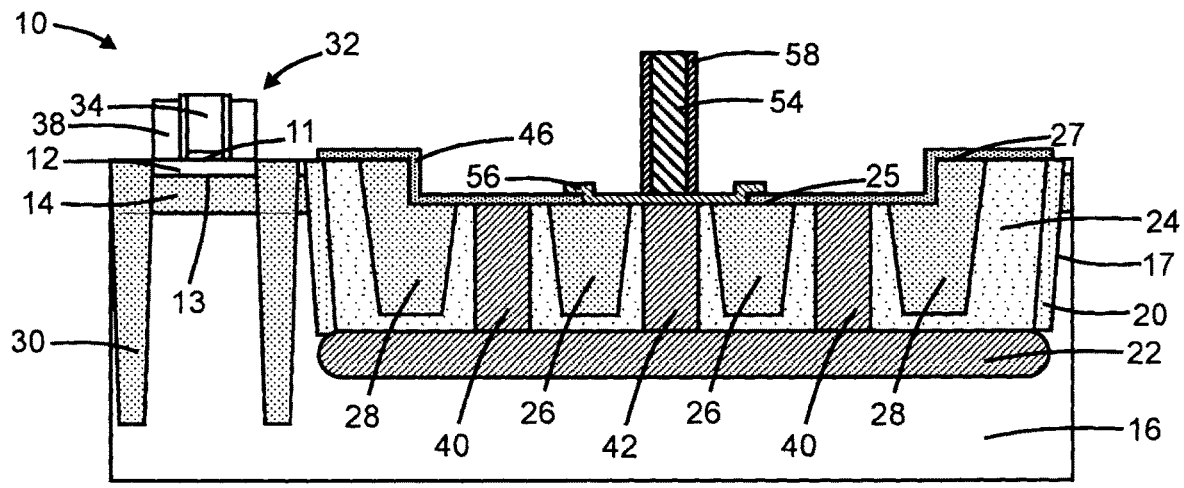

With reference to FIG. 5 in which like reference numerals refer to like features in FIG. 4 and at a subsequent fabrication stage of the processing method, a dielectric layer 46 is deposited and patterned by lithography and etching processes to define an opening that overlaps with the doped region 42 and the shallow trench isolation regions 28 on opposite sides of the doped region 42. An emitter 54 and a base layer 56 of the vertical heterojunction bipolar transistor may be formed inside the opening with the emitter 54 positioned on the base layer 56.

The emitter 54 may be formed by epitaxially growing or depositing a layer comprised of a semiconductor material and patterning the layer with lithography and etching processes. The emitter 54 may be comprised of a heavily-doped semiconductor material, such as polysilicon that is heavily doped with a concentration of a n-type dopant (e.g., phosphorus or arsenic) to provide n-type conductivity. The base layer 56 may be formed by epitaxially growing or depositing a layer comprised of a semiconductor material and patterning the layer with lithography and etching processes. In an embodiment, the base layer 56 may be comprised of silicon-germanium including silicon and germanium with the silicon content ranging from 95 atomic percent to 50 atomic percent and the germanium content ranging from 5 atomic percent to atomic percent. The base layer 56 may be doped with a concentration of a dopant, such as a p-type dopant (e.g., boron) that provides p-type conductivity. In an embodiment, the layer patterned to form the base layer 56 may be formed before the layer patterned to form the emitter 54 is formed, and the emitter 54 may be patterned before the base layer 56 is patterned. Dielectric spacers 58 comprised of an electrical insulator may be subsequently formed at the side edges of the emitter 54.

The base layer 56 overlaps with the doped region 42 providing the collector of the vertical heterojunction bipolar transistor, and the emitter 54 overlaps with the base layer 56. In an embodiment, the emitter 54 may be centered on the base layer 56. The base layer 56 also overlaps with the shallow trench isolation region 26 in the semiconductor layer 24. In an embodiment, the emitter 54 may be centered on the doped region 42. The base layer 56 is positioned in a vertical direction between the emitter 54 and the doped region 42. The base layer 56 is positioned in a vertical direction fully below the interface 13. A portion of the emitter 54 is positioned in a vertical direction fully below the interface 13. The emitter 54 may include another portion that is positioned in the vertical direction above the interface 13.

Figure 6:
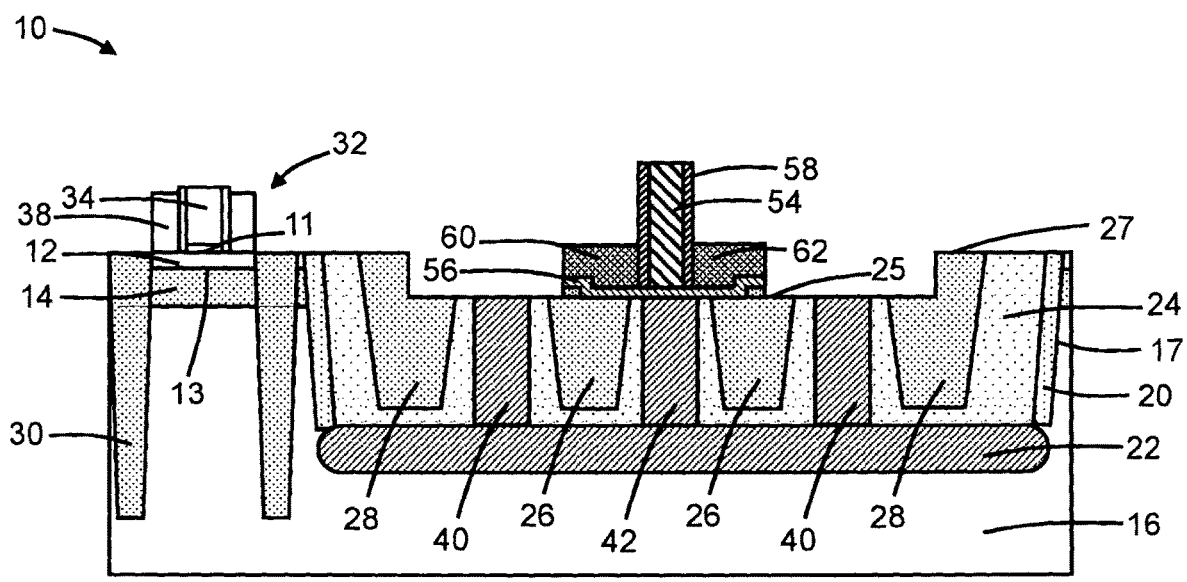

With reference to FIG. 6 in which like reference numerals refer to like features in FIG. 5 and at a subsequent fabrication stage of the processing method, semiconductor layers 60, 62 are formed as raised features on respective sections of the base layer 56 that are exposed adjacent to the opposite sides of the emitter 54. The dielectric spacers 58 are positioned between the semiconductor layers 60, 62 and the emitter 54. The semiconductor layers 60, 62 may provide an extrinsic base of the vertical heterojunction bipolar transistor that is used to contact the base layer 56. The semiconductor layers 60, 62 may be comprised of a semiconductor material, such as silicon or silicon-germanium, and may be concurrently formed by a selective epitaxial growth process. The semiconductor layers 60, 62 may be doped (e.g., heavily doped) with a concentration of a dopant, such as a p-type dopant (e.g., boron) to provide p-type conductivity.

After forming the semiconductor layers 60, 62, the dielectric layer 46 is removed by an etching process to expose the doped regions 40. Portions of the dielectric layer 46 remain unetched where overlapped by the base layer 56 and semiconductor layers 60, 62. The protection layer may also be removed from the field-effect transistor 32.

Figure 7:
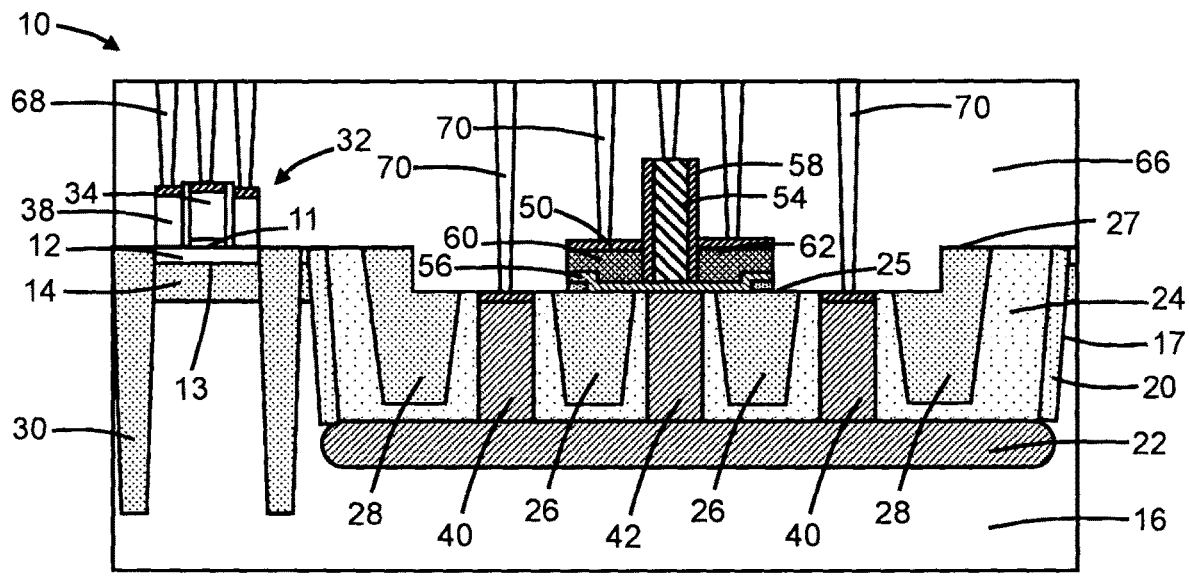

With reference to FIG. 7 in which like reference numerals refer to like features in FIG. 6 and at a subsequent fabrication stage of the processing method, a silicide layer 64 comprised of, for example, nickel silicide is formed with sections on the doped regions 40, the emitter 54, and the semiconductor layers 60, 62 of the vertical heterojunction bipolar transistor, as well as on the gate electrode 34 and raised source/drain regions 38 of the field-effect transistor 32. A stress liner (not shown) may be applied over the vertical heterojunction bipolar transistor and the field-effect transistor 32.

Middle-of-line processing and back-end-of-line processing follow, which includes deposition of a dielectric layer 66 and the formation of contacts 68, 70 in the dielectric layer 66. The contacts 68 extend in a vertical direction to be coupled to the gate electrode 34 and the raised source/drain regions 38 of the field-effect transistor 32. The contacts 70 extend in a vertical direction to be coupled to the doped regions 40, the emitter 54, and the semiconductor layers 60, 62 of the vertical heterojunction bipolar transistor. The contacts 70 connected to the doped regions 40 are taller than the contacts 68 connected to the gate electrode 34 and raised source/drain regions 38 because the vertical heterojunction bipolar transistor is located at a lower level or elevation in the structure 10 than the field-effect transistor 32.

The embodiments disclosed herein may find application in radiofrequency circuits and, in particular, may find application in 5G and 6G radiofrequency circuits. The vertical heterojunction bipolar transistor includes a collector, a base layer, and an emitter arranged with a vertical architecture in a vertical stack. The compatibility of the vertical architecture of the vertical heterojunction bipolar transistor with the field-effect transistor 32, in a layout on the same FDSOI substrate, is improved by recessing the vertical heterojunction bipolar transistor relative to the field-effect transistor 32 such that the vertical heterojunction bipolar transistor is located at a lower elevation or level in the structure than the field-effect transistor 32. The vertical heterojunction bipolar transistor may be characterized by high performance metrics, such as high values of Ft and Fmax, and may be formed without impacting the performance and reliability of the field-effect transistor 32.

In embodiments, the vertical heterojunction bipolar transistor and the field-effect transistor 32 may be formed in distinct regions of a silicon-on-insulator substrate having different characteristics. In one region, the silicon-on-insulator substrate includes the semiconductor layer 12 as a device layer, the substrate 16, and a buried insulator layer provided by the dielectric layer 14 between the device layer and the substrate 16. The field-effect transistor 32 may be formed in this region of the silicon-on-insulator substrate using the device layer. In another region, the silicon-on-insulator substrate includes only the substrate 16 due to the removal of the device layer and buried insulator layer by the formation of the trench 18. The vertical heterojunction bipolar transistor may be formed in this region of the silicon-on-insulator substrate and, more particularly, may be formed using the semiconductor layer 24 inside the trench 18.

Figure 8:
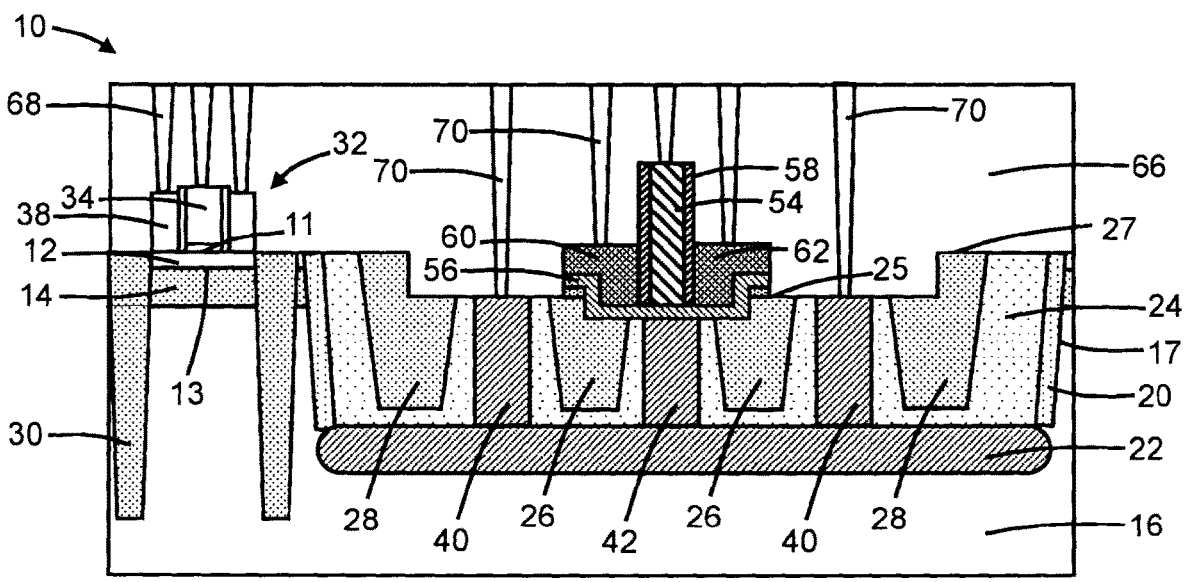
FIG. 8 is a cross-sectional view of a structure in accordance with alternative embodiments of the invention.

With reference to FIG. 8 and in accordance with alternative embodiments, the emitter 54, base layer 56, and semiconductor layers 60, 62 may be formed at least in part inside a recess defined inside the cavity 44. The base layer 56 and semiconductor layers 60, 62 may have peripheral edges that overlap with the dielectric layer 46 on the shallow trench isolation regions 26 surrounding the recess, and the emitter 54 may fully overlap with the recess.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor substrate including a trench;
a first semiconductor layer including a portion adjacent to the trench;
a dielectric layer between the first semiconductor layer and the semiconductor substrate, the dielectric layer having an interface with the first semiconductor layer;
a second semiconductor layer in the trench, the second semiconductor layer including a first portion that is recessed relative to the interface;
a first shallow trench isolation region in the second semiconductor layer; and
a vertical heterojunction bipolar transistor including a collector in the first portion of the second semiconductor layer and a base layer, the base layer including a first portion that overlaps with the first shallow trench isolation region.

2. The structure of claim 1 wherein the collector is positioned below the interface, and further comprising:
a field-effect transistor including a gate electrode on the first semiconductor layer, the gate electrode positioned above the interface.

3. The structure of claim 2 wherein the first semiconductor layer has a thickness in a range of about 1 nanometers to about 20 nanometers.

4. The structure of claim 1 wherein the vertical heterojunction bipolar transistor includes a sub-collector in the semiconductor substrate, and the sub-collector is positioned in a vertical direction beneath the trench.

5. The structure of claim 4 wherein the trench has a width, and the sub-collector comprises a well that extends in a lateral direction in the semiconductor substrate over an entirety of the width of the trench.

6. The structure of claim 4 wherein the vertical heterojunction bipolar transistor includes a doped region in the first portion of the second semiconductor layer, the doped region is coupled by the sub-collector with the collector, and further comprising:
a contact extending in the vertical direction to the doped region.

7. The structure of claim 4 wherein the base layer includes a second portion that overlaps with the collector, the vertical heterojunction bipolar transistor includes an emitter on the base layer, and the base layer is fully positioned in the vertical direction below the interface.

8. The structure of claim 1 wherein the base layer includes a second portion that overlaps with the collector, and the base layer is fully positioned in a vertical direction below the interface.

9. The structure of claim 1 wherein the first shallow trench isolation region penetrates partially through the second semiconductor layer.

10. The structure of claim 8 wherein the vertical heterojunction bipolar transistor includes an emitter on the base layer, and the emitter extends from the base layer above the interface.

11. The structure of claim 1 further comprising:
a second shallow trench isolation region in the second semiconductor layer, the second shallow trench isolation region including a first portion adjacent to the portion of the second semiconductor layer and a second portion, the first portion recessed relative to the interface, and the second portion projecting above the first portion to define a step.

12. The structure of claim 11 wherein the second semiconductor layer includes a second portion that is not recessed relative to the interface, the trench includes a sidewall, and the second portion of the second semiconductor layer is positioned in a lateral direction between the first portion of the second semiconductor layer and the sidewall of the trench.

13. The structure of claim 1 further comprising:
a deep trench isolation region penetrating through the first semiconductor layer and the dielectric layer into the semiconductor substrate.

14. The structure of claim 13 wherein the vertical heterojunction bipolar transistor includes a sub-collector in the semiconductor substrate, the sub-collector is positioned in a vertical direction below the trench, the first shallow trench isolation region is positioned in the vertical direction fully above the sub-collector, and the deep trench isolation region penetrates to a depth below the sub-collector.

15. The structure of claim 1 wherein the trench includes a sidewall, and further comprising:
a dielectric collar positioned between the first semiconductor layer and the sidewall of the trench.

16. The structure of claim 1 wherein the base layer comprises silicon-germanium, and the second semiconductor layer comprises single-crystal silicon.

17. The structure of claim 1 wherein the vertical heterojunction bipolar transistor includes an emitter, and the base layer is disposed in a vertical direction between the emitter and the collector in the second semiconductor layer.

18. The structure of claim 1 wherein the first shallow trench isolation region comprises a dielectric material.

19. The structure of claim 11 wherein the first shallow trench isolation region and the second shallow trench isolation region penetrate partially through the second semiconductor layer.

20. A method comprising:
forming a trench in a semiconductor substrate, wherein a first semiconductor layer includes a portion adjacent to the trench, a dielectric layer is positioned between the first semiconductor layer and the semiconductor substrate, and the dielectric layer has an interface with the first semiconductor layer;
forming a second semiconductor layer in the trench, wherein the second semiconductor layer includes a portion that is recessed relative to the interface;
forming a shallow trench isolation region in the second semiconductor layer; and
forming a vertical heterojunction bipolar transistor including a collector in the portion of the second semiconductor layer and a base layer, wherein the base layer includes a portion that overlaps with the shallow trench isolation region.

* * * * *